United States Patent [19]

Ahn et al.

[11] Patent Number: 5,342,796
[45] Date of Patent: Aug. 30, 1994

[54] METHOD FOR CONTROLLING GATE SIZE FOR SEMICONDUCTION PROCESS

[75] Inventors: Sung T. Ahn; Shigeki Hayashida, both of Nara, Japan

[73] Assignee: Sharp Kabushiki Kaisha, Osaka, Japan

[21] Appl. No.: 887,753

[22] Filed: May 27, 1992

[30] Foreign Application Priority Data

May 28, 1991 [JP] Japan .................. 3-123957
Jun. 25, 1991 [JP] Japan .................. 3-153418

[51] Int. Cl.$^5$ .......................... H01L 21/265
[52] U.S. Cl. ........................ 437/41; 437/29; 437/44; 437/203
[58] Field of Search ............... 437/203, 67, 950, 44, 437/38, 72, 41, 29; 257/327, 283, 288, 309, 330–332

[56] References Cited

U.S. PATENT DOCUMENTS

| | | | |
|---|---|---|---|
| 4,685,196 | 8/1987 | Lee | 437/41 |
| 4,803,173 | 2/1989 | Sill et al. | 437/29 |
| 4,939,100 | 7/1990 | Jeuch et al. | 437/203 |
| 4,992,388 | 2/1991 | Pfiester | 437/31 |

FOREIGN PATENT DOCUMENTS 2-98939  4/1990  Japan .
2-98940  4/1990  Japan .

Primary Examiner—Olik Chaudhuri
Assistant Examiner—H. Jey Tsai
Attorney, Agent, or Firm—Nixon & Vanderhye

[57] ABSTRACT

A method for preparing a semiconductor device comprises the following steps: (I) depositing at least nitride film on the whole surface of a semiconductor substrate having a field oxide film, (II) removing a portion of the nitride film from a gate-formation region to form an opening at the nitride film up to the substrate, (III) thereafter forming by selective oxidation a vertically projecting oxide film on the substrate at the opening portion, (IV) then removing all the films including the oxide film and the nitride film each covering the substrate to form a dug part of the substrate at the gate formation region, (V) providing on the dug part a gate oxide film and a gate electrode in the order, (VI) doping an impurity ion into the substrate in a manner of self-alignment using the gate electrode as a mask, and (VII) applying heat treatment to the substrate to form an impurity-diffused region.

2 Claims, 5 Drawing Sheets

METHOD FOR CONTROLLING GATE SIZE FOR SEMICONDUCTION PROCESS

FIELD OF THE INVENTION

The invention relates to a semiconductor device and a method for preparing the same, and more particularly to a semiconductor device and a method for preparing the same useful for forming channel regions of insulating gate type of field effect transistors or the like.

DESCRIPTION OF THE RELATED ART

A conventional method for preparing MOS transistors comprises the following steps: depositing gate oxide film and polysilicon (in order) on a flat silicon substrate after a device-isolating region is provided on the substrate; forming a gate electrode by photolithography; highly dopins an impurity on the silicon substrate, particularly on the gate electrode in a self-aligned manner; and forming source/drain regions by annealing the substrate.

The annealing (carried out, after the doping of impurity ions, for forming the source/drain regions) is usually a heat treatment at a relatively higher temperature for eliminating the substrate's defects caused by the doping of impurity. The higher the temperatures for the heat treatment, the more widely the diffusion of the impurity extends, leading to difficultly in reduction (scaling) of junction depth of the source/drain regions.

The source/drain regions should be reduced in junction depth for achieving subminiaturization of MOS devices but have problems of increased sheet resistance and lowered driving force for transistors when the junction depth is small.

Also, when temperatures for the annealing are set to be lower for scaling the junction depth of source/drain regions, there are created such problems that any defects of the substrate caused by the doping of impurity are not remedied, and a junction leak current related to the substrate's defects increases.

SUMMARY OF THE INVENTION

An object of the present invention is to lessen an effective junction depth of a diffusing region of a high doped impurity with respect to channel regions.

The present invention provides a method for preparing a semiconductor device comprising the following steps:

(I) depositing at least a nitride film on the whole surface of a semiconductor substrate having a field oxide film, (II) removing a portion of the nitride film from a gate-formation region to form an opening at the nitride film up to the substrate, (III) thereafter forming by selective oxidation a vertically projecting oxide film on the substrate at the opening portion, (IV) then removing all the films including the oxide film and the nitride film each covering the substrate to form a dug part of the substrate at the gate formation region, (V) providing on the dug part a gate oxide film and a gate electrode in the order, (VI) doping an impurity ion into the substrate in a manner of self-alignment using the gate electrode as a mask, and (VII) applying heat treatment to the substrate to form an impurity-diffused region.

The present invention also provides a method for preparing a semiconductor device comprising the following steps:

(I') depositing at least a polysilicon layer and nitride film on the whole surface of a semiconductor substrate having field oxide, (II') removing a portion of the nitride film from a gate-formation region to form an opening at the nitride film up to the polysilicon layer, (III') thereafter forming by selective oxidation a vertically projecting oxide film on the substrate and the polysilicon layer at the opening portion, (VI') then removing the nitride film and doping an impurity ion into the polysilicon layer, (IV') removing the oxide film to form a dug part of the substrate in the gate formation region, (V') providing on the dug part a gate oxide film and a gate electrode in the order, and (VII') applying heat treatment to the substrate to form an impurity-diffused region.

The present invention also provides a semiconductor device comprising:

a semiconductor substrate where a dug part is formed in the substrate itself, a gate oxide film formed on the semiconductor substrate, a gate electrode formed on the gate oxide film at a position where the dug part is located and impurity-diffused regions formed in an area of a surface of the semiconductor substrate.

DETAILED DESCRIPTION OF THE PREFERRED EMBODIMENTS

The semiconductor substrate to be used in the present invention may be a compound semiconductor such as GaAs, and is preferably made of silicon and is provided thereon with a field oxide film by conventional methods, such as LOCOS method or the like.

In the step (I) or (I'), at least a nitride film is deposited about 0.1 to 0.12 $\mu$m on the whole top surface of the silicon substrate including the field oxide film by use of conventional methods, such as CVD method or the like. A polysilicon layer and an oxide film may be layered respectively between the substrate and the nitride film by conventional methods, such as thermal oxidation, CVD method or the like. The thickness of the polysilicon layer is preferably in such a range that the ion implantation or doping in a subsequent step will not permit ions to reach into the substrate and that an ion amount enough to form the impurity diffused layer will be attained. The thickness of the polysilicon is preferably in a range of about 0.05 to 0.1 $\mu$m, and oxide film is preferably about 0.1 to 0.2 $\mu$m in thickness.

In the step (II) or (II'), a conventional etching process may be used for completing an opening in the nitride film at the gate formation region from which a part of the nitride film is previously removed. In the case where an oxide film and a nitride film are deposited (in order) on the silicon substrate, both the oxide and nitride films at the gate formation region are removed for providing an opening up to the substrate. In the case where polysilicon, oxide and nitride films are layered in order on the substrate, the oxide and nitride films are removed from the gate formation region to cause the polysilicon layer to be exposed.

In step (III) or (III'), an oxide film in and on the opening portion may be provided by conventional methods, preferably a selective thermal oxidation to have thickness of 0.15 to 0.3 μm at its thickest part.

Figure 4:
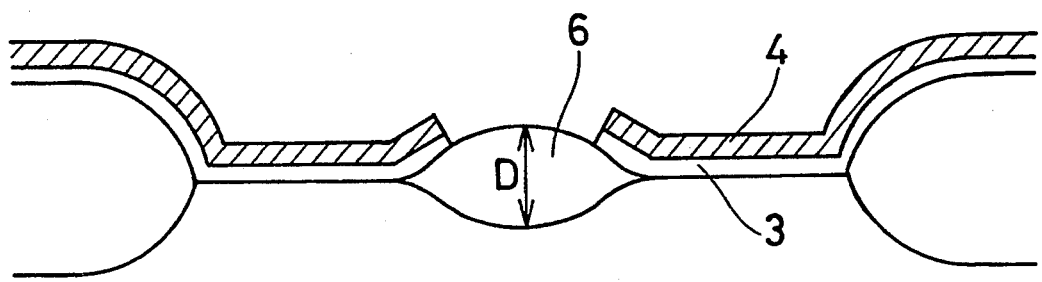

In step (IV) or (IV'), the dug part of the substrate is formed by completely removing the oxide film in and on the opening portion by use of the conventional etching process, wherein the wet etching is preferable. In the procedure, the oxide and nitride films layered in the previous process are also removed, resulting in the provision of the dug part in the substrate optionally including the polysilicon layer. The depth of the dug part is equivalent to 45% of the thickness of the removed oxide film (see FIG. 4; H, FIG. 12; M).

In step (V) or (V'), a gate oxide film and polysilicon are layered in order in the dug part of substrate to form a desired gate electrode by conventional methods.

In step (VI), by using the gate electrode as a mask, an impurity ion, for example, As or P, may be doped at $1 \times 10^{14}$ to $1 \times 10^{16}$ ions/cm$^2$ by 40 to 80 keV in a manner of self-alignment.

In step (VI'), the doping of an impurity ion may be carried out before formation of the dug part, followed by etching to remove the oxide film from the opening portion.

In step (VII) or (VII'), the substrate is applied with a conventional heat treatment at 850° to 900° C. for 30 to 60 min to form an impurity diffused region.

In the case that polysilicon is layered between the substrate and the nitride film, an impurity ion is doped at $1 \times 1 \times 10^{15}$ to $1 \times 10^{16}$ ions/cm$^2$ by 50 to 70 keV into the polysilicon layer and the heat treatment is applied to cause the doped impurity ion to be diffused from the polysilicon layer to the substrate with thermal diffusion, thereby allowing the impurity ion diffused region to be formed in a manner of self-alignment.

The preferable depth of the dug part differs depending on which kind of ion element is applied in the subsequent step. In applying As, the preferably depth (H) thereof ranges about 0.07 to 0.12 μm, optimally about 0.09 μm, since As normally provides the junction depth about 0.1 μm. In applying boron, the preferable depth (H) thereof ranges about 0.1 to 0.2 μm, since boron provides a deeper junction depth than As.

The invention has been explained based on n-type MOS transistor but may alternatively be directed and applicable to p-type MOS transistor or others with the substantially same effects.

Next, an example of the present invention will be detailed with referring to the accompanied drawings.

Figure 9:
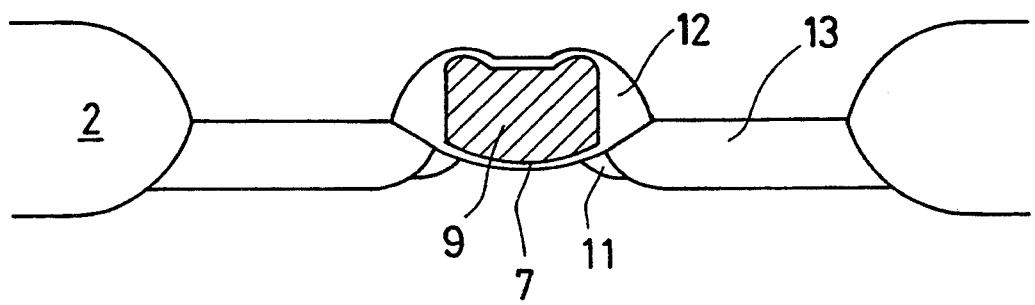

As shown in FIG. 9, the semiconductor device comprises a silicon substrate 1 where a dug part is formed and having thereon LOCOS 2 serving as an interlayer film, a gate oxide film 7 on the silicon substrate 1, a gate electrode 9 formed on the gate oxide film 7 at a position where the dug part is located and impurity-diffused regions 11, 13 formed in an area of a surface of the silicon substrate 1 including a side wall of the dug part.

Next, an example of the method for preparing the semiconductor device will be detailed with reference to the accompanied drawings.

Figure 1:
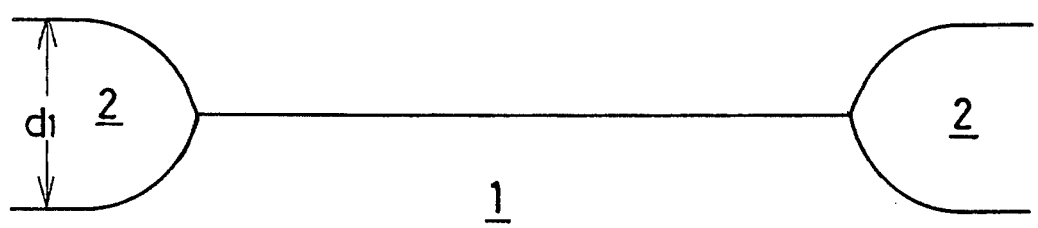
FIGS. 1 through 9 are schematic sectional view showing an example of the method for preparing the semiconductor device according to the present invention.
Figure 2:
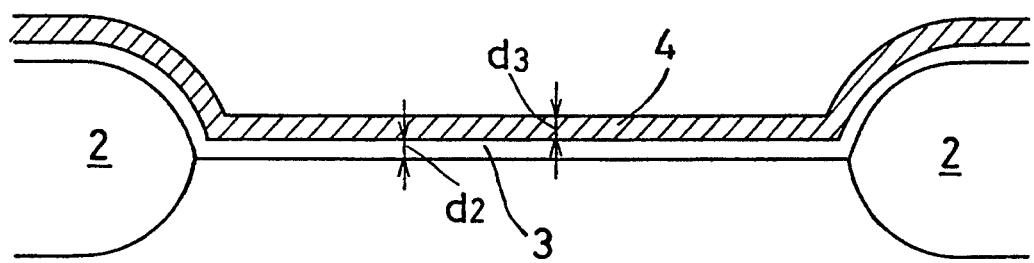

For preparing an n-type MOSFET, a field oxide film 2 which has thickness $d_1$ of about 0.4 μm for isolating devices is first formed, as shown in FIG. 1, on a silicon substrate 1 by conventional methods. A thin SiO$_2$ film 3 having thickness $d_2$ of about 0.03 μm is layered on the whole surface of the substrate 1 and the field oxide film 2 by thermal oxidation. A SiN film 4 having thickness $d_3$ of about 0.12 μm is then deposited on the whole surface of the SiO$_2$ film 3 by CVD process (FIG. 2).

Figure 3:
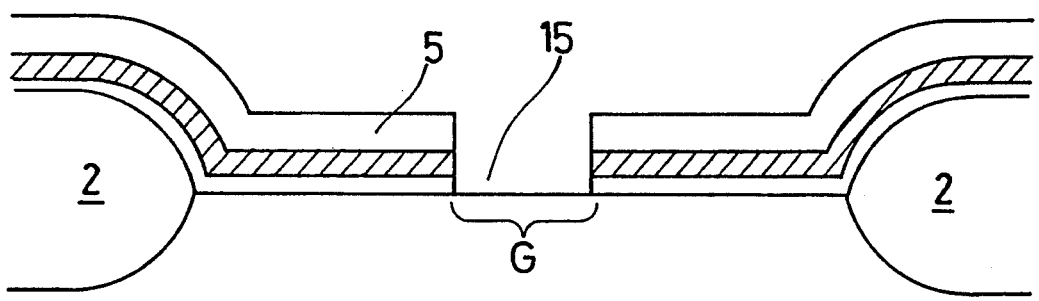

The SiO$_2$ film 3 and SiN film 4 are etched at a gate formation region G between the field oxide films 2 by photolithography to form an opening portion 15 (FIG. 3). Employed in this case are a photoresist 5 reversed in type to a photo-mask for a gate layer and another photoresist used in a photolithographic process for a gate structure.

After removal of the photo-resist 5, silicon of the substrate 1 at the opening portion 15 is oxidized by a selective oxidation method to form a SiO$_2$ film 6 having thickness D of about 0.2 μm.

Figure 5:
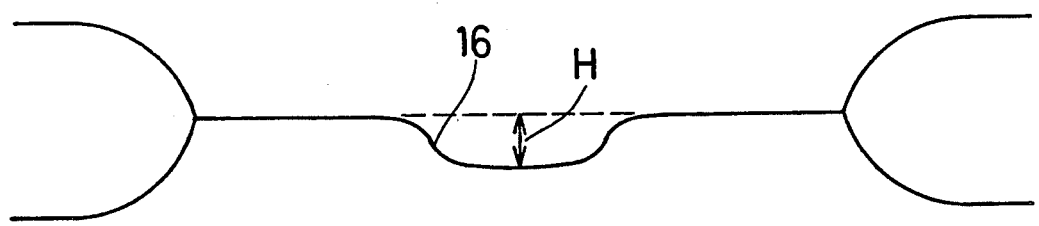

The SiO$_2$ film 6 is then etched by using the SiN film 4 as an etching mask (FIG. 5). In this instance, the SiN film 4 and SiO$_2$ film 3 (on the substrate 1 and on the field oxide film 2) are substantially removed to provide a dug part 16 having depth H of about 0.09 μm in the substrate 1.

Figure 6:
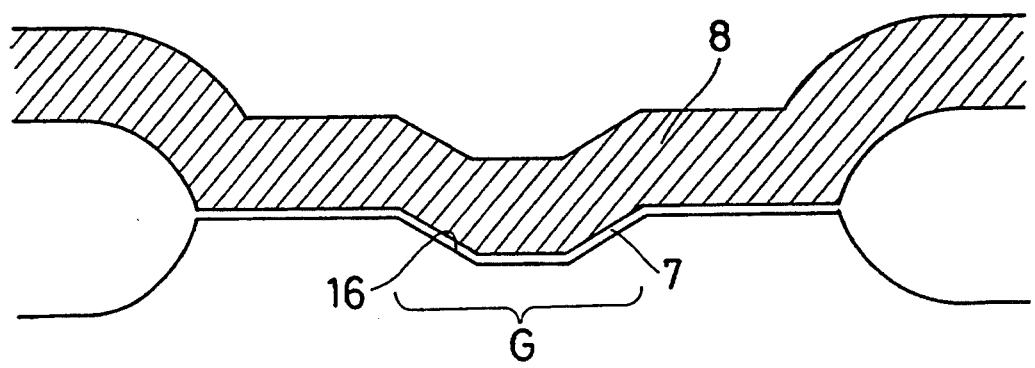
Figure 7:
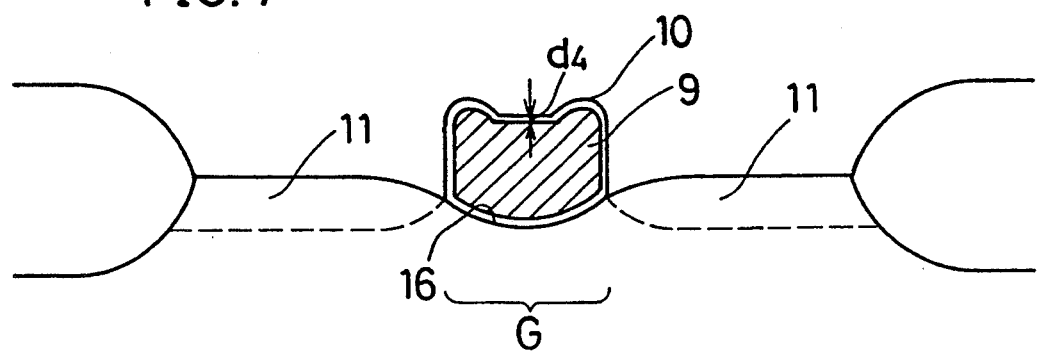

Conventional preparing method for transistors are further carried out to complete a MOS transistor. In detail, a gate oxide film 7, about 0.01 μm thick, is formed as shown in FIG. 6 on which polysilicon 8, about 0.2 μm thick, is layered, followed by removing the polysilicon 8 except the part at the gate region G to form a gate electrode 9 as shown in FIG. 7.

A thermal oxide film 10, 0.01 μm in thickness $d_4$, serving as a protective film is deposited on the gate electrode 9. By using the gate electrode 9 as a mask, for example, As and P are doped at $1 \times 10^{15}$ ions/cm$^2$ by 80 keV into the substrate in a self-aligned manner to form a less doped impurity region 11.

Figure 8:
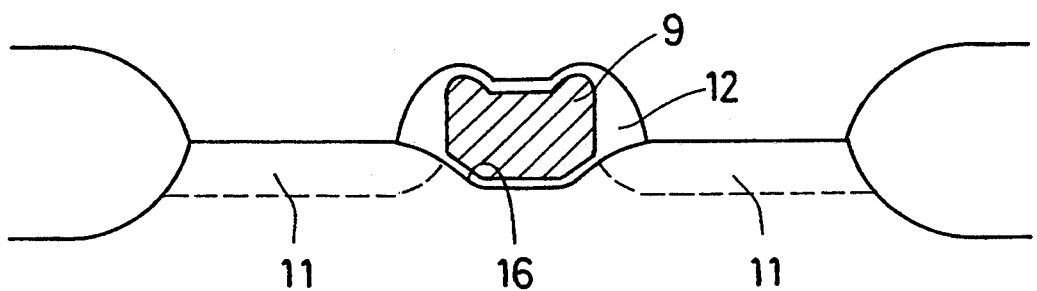

SiO$_2$ is then layered about 0.15 μm on the whole surface of the silicon substrate 1 and the gate electrode 9 and etched to provide the electrode with a sidewall 12 (FIG. 8).

As and P of $1 \times 10^{16}$ ions/cm$^2$ are highly doped into the substrate 1 by using the gate electrode 9 and the sidewall 12 as a mask, followed by heat treatment at 950° C. for 60 min to form source/drain regions 13 behaving as an impurity-diffused region (FIG. 9).

Conventional processes are further carried out to provide a wiring film, thereby completing the device.

The field oxide film 2 shown in FIG. 1 may be formed after formation of the dug part of substrate shown in FIG. 5 in the above course of processes.

Next, another example of the present invention will be detailed with referring to the accompanied drawings.

Figure 15:
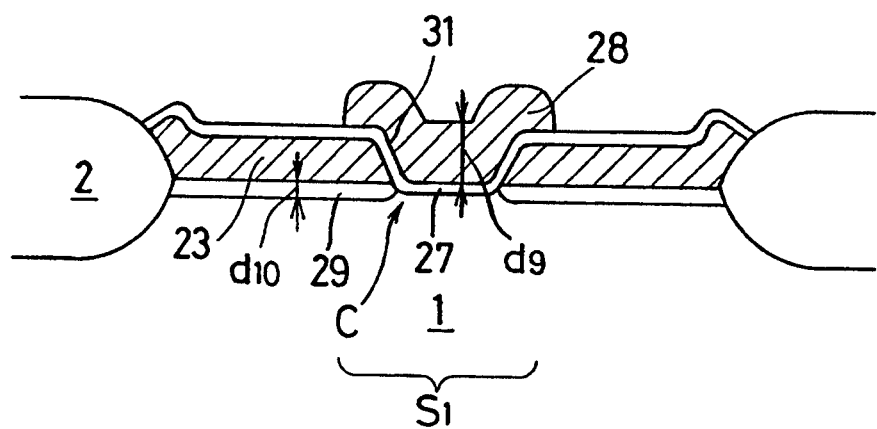

As shown in FIG. 15, the semiconductor device comprises a silicon substrate 1 covered with a polysilicon layer 23 through which a dug part is formed into the substrate, a gate oxide film 27 on the silicon substrate 1 and polysilicon layer 23, a gate electrode 28 formed on the gate oxide film 27 at a position where the dug part is located and impurity-diffused regions 29 formed in an area of a surface of the silicon substrate 1.

Next, the method for preparing the semiconductor device according to FIG. 15 of the present invention will be detailed.

Figure 10:
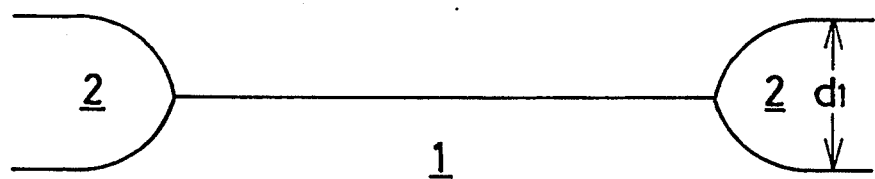
FIGS. 10 to 15 are schematic sectional view showing another example of a method for preparing the semiconductor device according to the present invention.
Figure 11:
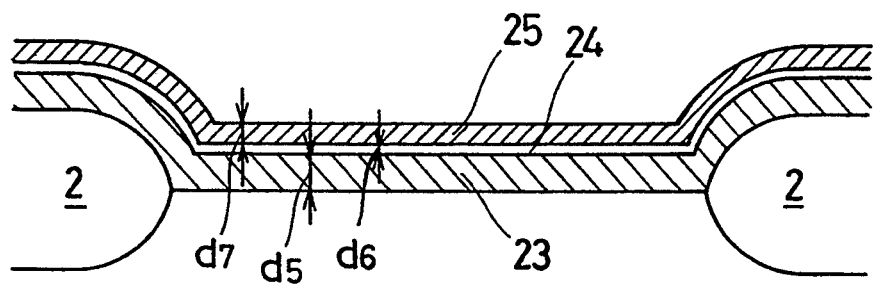

For preparing n-type MOSFET, a field oxide film 2 is first formed, as shown in FIG. 10, on a silicon substrate 1 in the same manner as the above example. Polysilicon 23 having thickness $d_5$ of 100 nm, $SiO_2$ 24 having thickness $d_6$ of about 20 nm and SiN 25 having thickness $d_7$ of about 100 nm are layered in order on the whole surface of the substrate 1 and the field oxide film 2 (FIG. 11).

The SiN film 25 and $SiO_2$ film 24 are etched by photolithography to form an opening.

Figure 12:
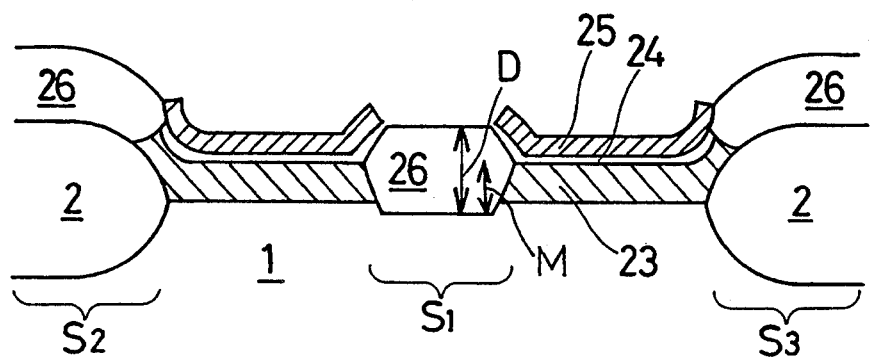

The exposed polysilicon layer 23 is oxidized by a known selective oxidation method to form selective oxidized films 26 of $SiO_2$ having thickness D of about 0.25 μm at the regions $S_1$, $S_2$ and $S_3$ (FIG. 12).

Figure 13:
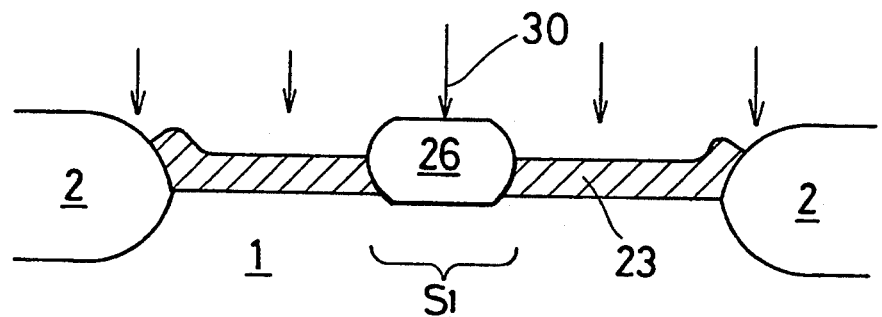

All the remaining SiN film 25 and $SiO_2$ film 24 is removed and P is doped at $1 \times 10^{16}$ cm$^2$ by 80 keV on the whole surface of the polysilicon film 23 and the $SiO_2$ films 26 at the regions $S_1$, $S_2$ and $S_3$ (FIG. 13).

The $SiO_2$ film 26 is then removed by a conventional etching process to form a dug part 31 of the substrate.

Figure 14:
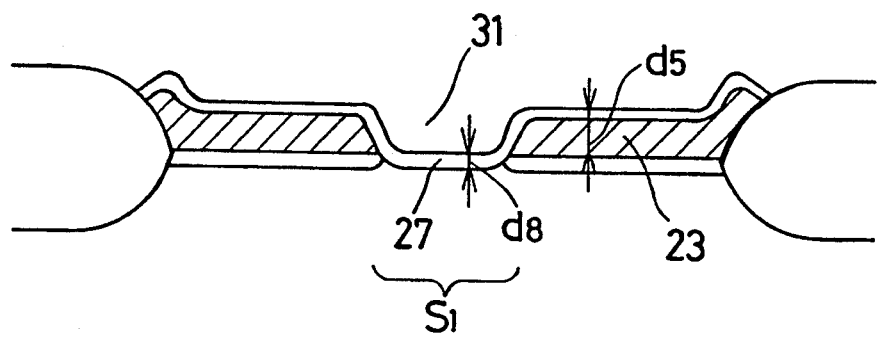

A gate oxide film 27 having thickness $d_8$ of about 0.01 μm is formed on the polysilicon layer 23 and the substrate 1 (FIG. 14). In this instance, the dug part 31 in the substrate 1 at the region $S_1$ is given by the etching process a depth corresponding at least to the thickness $d_8$ of the gate oxide film 27. Then, a polysilicon layer 28 having thickness $d_9$ of 0.25 μm is formed on the whole surface of the polysilicon layer 23 including the dug part 31. P is doped at $1 \times 10^{20}$ to $1 \times 10^{21}$ ions/cm$^2$ on the polysilicon layer 28 which is then patterned by the conventional photolithography to form a gate electrode 28 at the region S1 on the substrate 1 through the gate oxide film 27, followed by the conventional heat treatment to complete the source/drain regions 23 serving as an impurity-diffused region (FIG. 15). In this case, source and drain 29 may be formed by diffusion of an impurity from the polysilicon film 23. Customary processes are further carried out to provide a wiring film, thereby completing the device.

As seen from the above, the example does, in the course of preparing MOS transistors, dig the silicon substrate 1 at its part, which is for forming channel regions of transistors, to provide the dug part 16. Hence, the effective junction depth of channel regions can be reduced without dependence on the sequential impurity doping process and heat treatment process, thereby enabling short channel effect in MOS devices to be restrained, preventing junction leak current and improving a driving force for MOS devices.

What we claimed is:

1. A method for preparing a semiconductor device comprising the following steps:
    (I') depositing at least a polysilicon layer and a nitride film on a semiconductor substrate having a field oxide film,
    (II') removing a portion of the nitride film from a gate-formation region to form an opening at the nitride film for exposing the polysilicon layer,
    (III') thereafter forming by selective oxidation a vertically projecting oxide film on the substrate and the polysilicon layer at the opening portion, the vertically projecting oxide film having a thickness of about 0.1 to 0.3 micrometers, and preferably 0.15 to 0.3 micrometers,
    (IV') then removing the nitride film in an active region and doping an impurity ion into the polysilicon layer, the impurity ion being doped at about 40 to 80 KeV and about $1 \times 10^{14}$ to $1 \times 10^{16}$ ions/cm$^2$,
    (V') removing the oxide film to form a dug part of the substrate in the gate formation region, the dug part having a depth of about 0.07 to 0.2 micrometers,
    (VI') providing, in order, on the dug part, a gate oxide film and a gate electrode, and
    (VII') applying heat treatment to the substrate to form an impurity-diffused region.

2. A method of claim 1, wherein in step (VII') the heat treatment is applied at about 850° to 900° C. and for about 30 to 60 min.

* * * * *